(12) United States Patent
Kim et al.

(10) Patent No.: US 7,098,130 B1
(45) Date of Patent: Aug. 29, 2006

(54) METHOD OF FORMING DUAL DAMASCENE STRUCTURE

(75) Inventors: Ji Soo Kim, Pleasanton, CA (US); Sangheon Lee, Sunnyvale, CA (US); S. M. Reza Sadjadi, Saratoga, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 11/016,304

(22) Filed: Dec. 16, 2004

(51) Int. Cl.
*H01L 21/4763* (2006.01)

(52) U.S. Cl. ....................... 438/638; 438/633
(58) Field of Classification Search ................ 438/633, 438/638, FOR. 355, FOR. 489
See application file for complete search history.

(56) References Cited

U.S. PATENT DOCUMENTS

| | | | |
|---|---|---|---|
| 6,025,259 A * | 2/2000 | Yu et al. ...................... | 438/618 |
| 6,156,643 A * | 12/2000 | Chan et al. .................. | 438/638 |
| 6,514,852 B1 * | 2/2003 | Usami ......................... | 438/624 |
| 6,627,540 B1 * | 9/2003 | Lee ............................. | 438/638 |
| 6,846,741 B1 * | 1/2005 | Cooney et al. .............. | 438/638 |
| 2002/0173143 A1 * | 11/2002 | Lee et al. .................... | 438/637 |
| 2003/0119307 A1 * | 6/2003 | Bekiaris et al. ............. | 438/638 |

* cited by examiner

*Primary Examiner*—Michelle Estrada

(57) ABSTRACT

A method for forming dual damascene features in a dielectric layer. Vias are partially etched in the dielectric layer. A trench pattern mask is formed over the dielectric layer. Trenches are partially etched in the dielectric layer. The trench pattern mask is stripped. The dielectric layer is further etched to complete etch the vias and the trenches in the dielectric layer.

16 Claims, 10 Drawing Sheets

METHOD OF FORMING DUAL DAMASCENE STRUCTURE

BACKGROUND OF THE INVENTION

The invention relates to the formation of semiconductor devices. More specifically, the invention relates to the formation of semiconductor devices using a dual damascene process.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

In semiconductor-based device (e.g., integrated circuits or flat panel displays) manufacturing, dual damascene structures may be used in conjunction with copper conductor material to reduce the RC delays associated with signal propagation in aluminum-based materials used in previous generation technologies. In dual damascene, instead of etching the conductor material, vias, and trenches may be etched into the dielectric material and filled with copper.

To facilitate discussion, FIG. 1A is a cross-sectional view of a stack 100 on a wafer 110 used in the dual damascene process of the prior art. A contact 104 may be placed in a dielectric layer 108 over a wafer 110. A barrier layer 112, which may be of silicon nitride or silicon carbide, may be placed over the contact 104 to prevent the copper diffusion. A low-k dielectric layer 120 may be placed over the barrier layer 112. An antireflective layer (ARL) 116 may be placed over the low-k dielectric layer 120. A patterned resist layer 132 may be placed over the ARL 116. The ARL 116 may be formed from silicon nitride, SiON, or other material with a high refractive index and high extinction coefficient.

In a via first dual damascene process, the stack 100 may be subjected to an etch, which etches a via 140 down to the barrier layer 112, as shown in FIG. 1B. Remaining photoresist mask material is also stripped. For low-k dielectrics such as organosilicate glass (OSG), when the stripping process uses an oxygen strip, exposed portions of the low-k dielectric may be damaged, as shown by damage regions 194 in FIG. 1B. This damage may increase RC delay and parasitic capacitance. A via plug fill may provide a spin on dielectric via plug material 137 which fills the vias and forms a layer over the low-k dielectric layer 120, as shown in FIG. 1C. As feature size decreases the via plug is more susceptible to form voids 139. These voids contribute to production defects. An example of one way that such voids may increase defects is explained below.

A photoresist trench pattern 145 is formed over the via plug material 137, as shown in FIG. 1C. A trench etch is used to form a trench 147, as shown in FIG. 1D. Some of the damaged areas 194 are etched away during the trench etch. Some of the via plug material 137 remains after the trench etch. In this example, due to the presence of large voids, the trench etched has punched through the via plug material and barrier layer 112, at 147 to expose part of a copper contact 104.

A subsequent trench pattern strip is used to remove the trench pattern and the remaining via plug, as shown in FIG. 1E. An oxygen ashing may be used to accomplish the strip. Oxygen ashing or other stripping processes may cause more damage regions 194 in the low-k dielectric and corrosion/oxidation 195 in the exposed portion of the copper contact 104, as shown in FIG. 1E. As a result, this example of a via first dual damascene process may provide damaged low-k dielectric regions and corroded/oxidized contacts.

SUMMARY OF THE INVENTION

To achieve the foregoing and in accordance with the purpose of the present invention a method for forming dual damascene features in a dielectric layer. Vias are partially etched in the dielectric layer. A trench pattern mask is formed over the dielectric layer. Trenches are partially etched in the dielectric layer. The trench pattern mask is stripped. The dielectric layer is further etched to complete etch the vias and the trenches in the dielectric layer.

In another manifestation of the invention a method for forming dual damascene features in a dielectric layer over a barrier layer is provided. Vias are partially etched in the dielectric layer, wherein the partially etched vias do not extend to the barrier layer. A trench pattern mask is formed over the dielectric layer. Trenches are partially etched in the dielectric layer. The trench pattern mask is stripped. The dielectric layer is further etched to complete etch the vias and the trenches in the dielectric layer, so that the completed vias extend to the barrier layer, wherein the dielectric layer is not under a mask pattern so that a top surface of the dielectric layer is etched.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
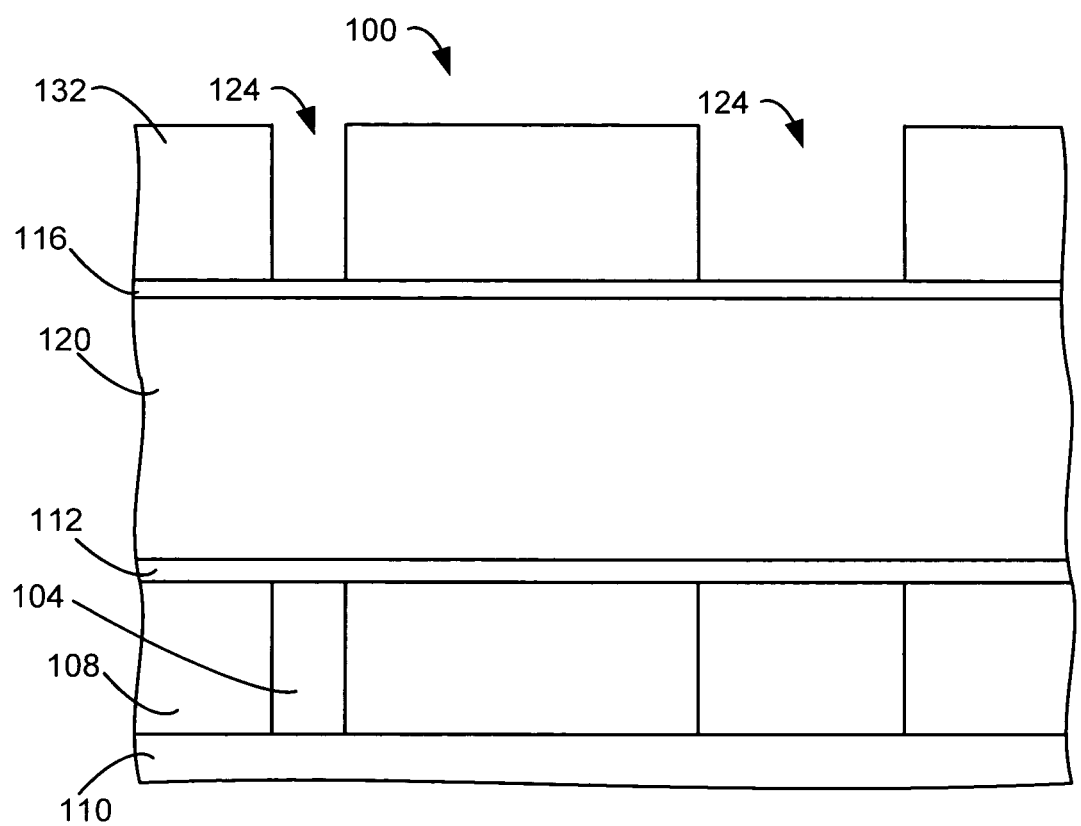
FIGS. 1A–E are schematic views of the formation of a dual damascene structure in the prior art.
Figure 1B:
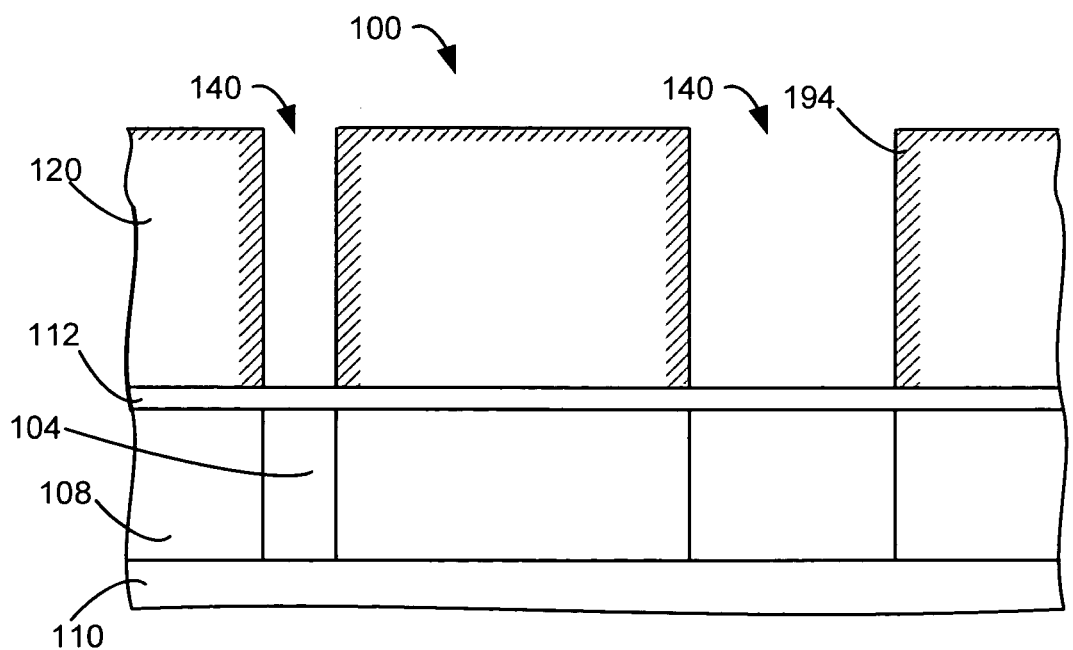
Figure 1C:
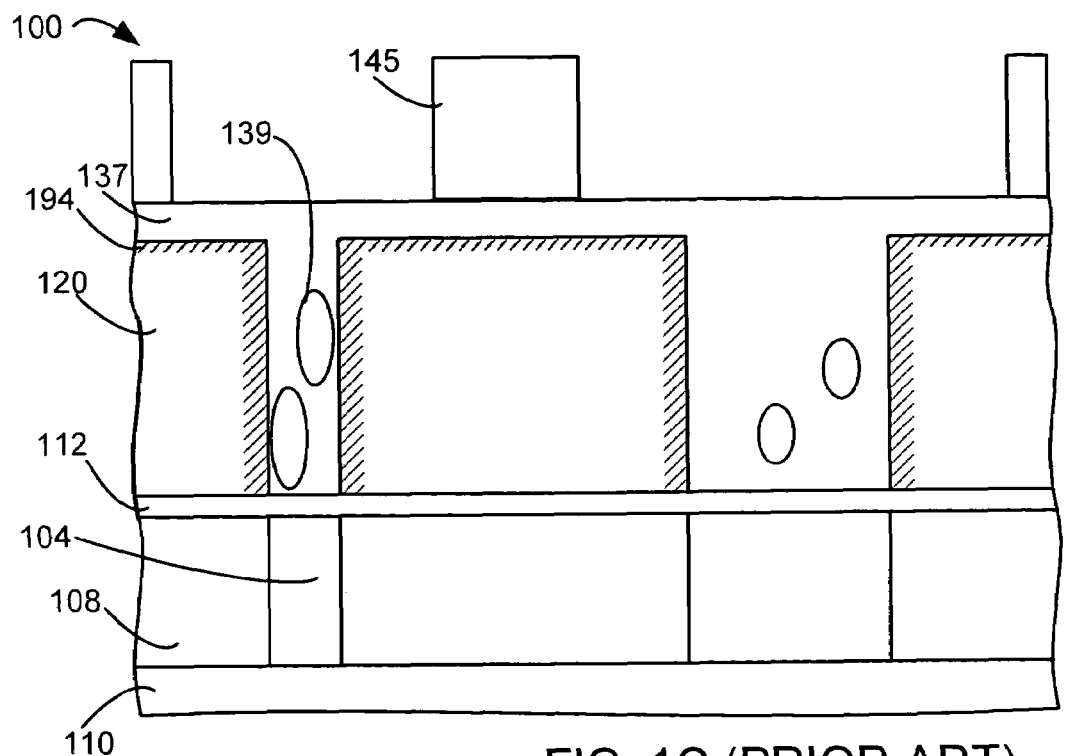
Figure 1D:
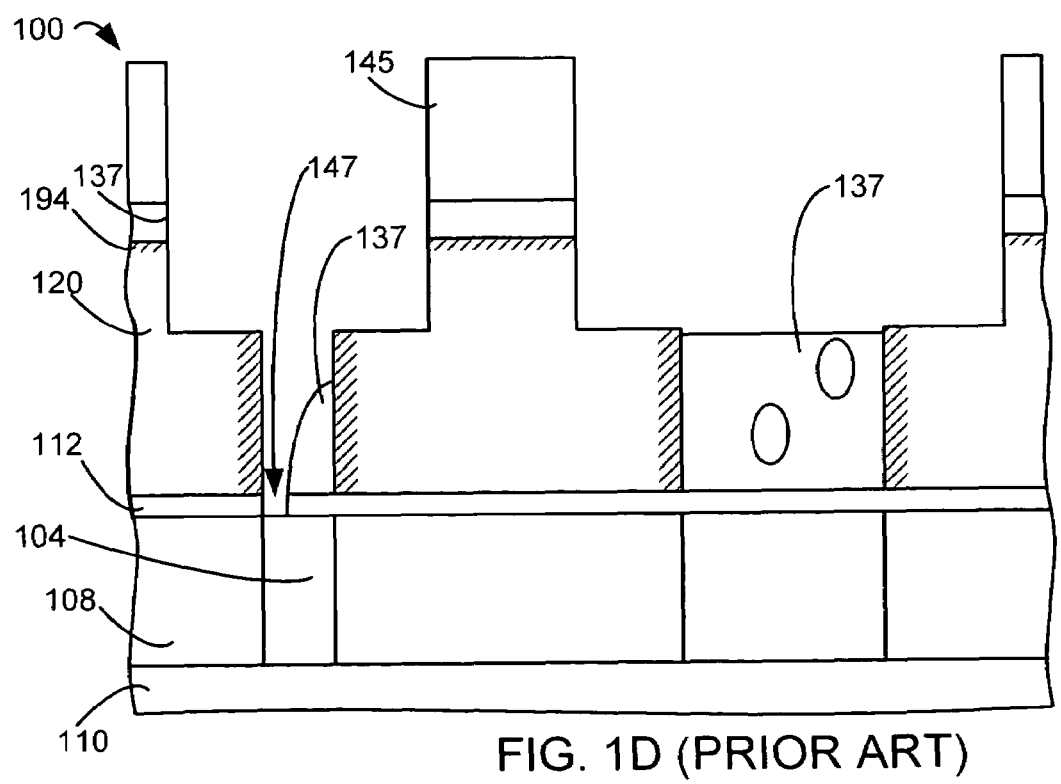
Figure 1E:
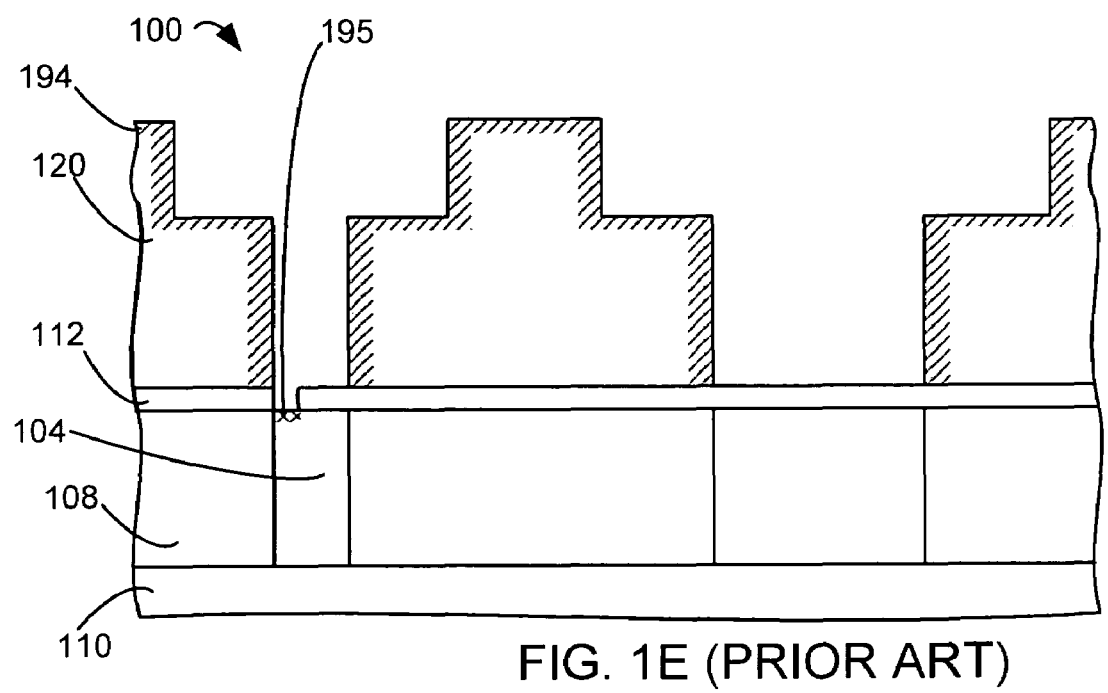
Figure 2:
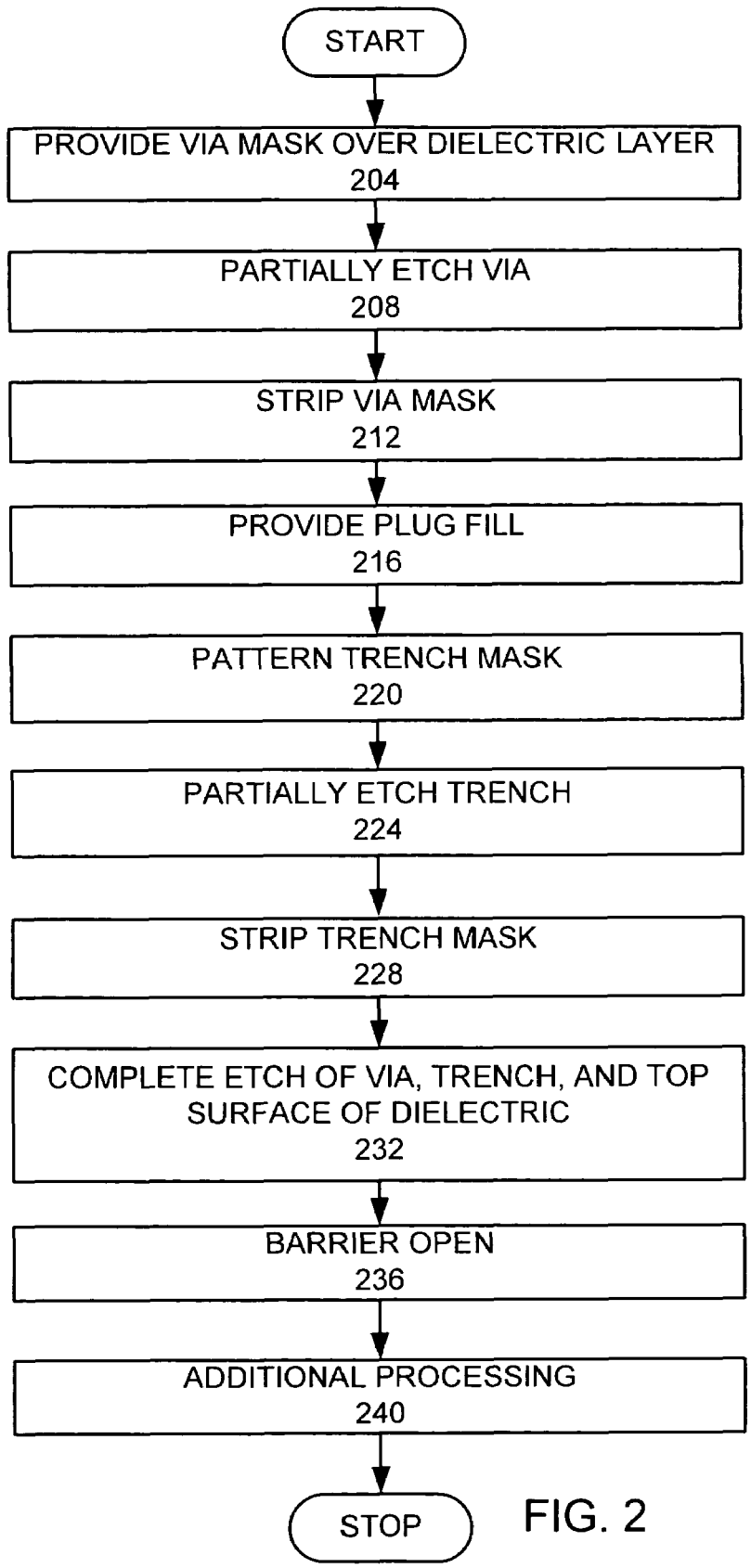
FIG. 2 is part of a flow chart of the formation of a dual damascene process used in an embodiment of the invention.
Figure 3A:
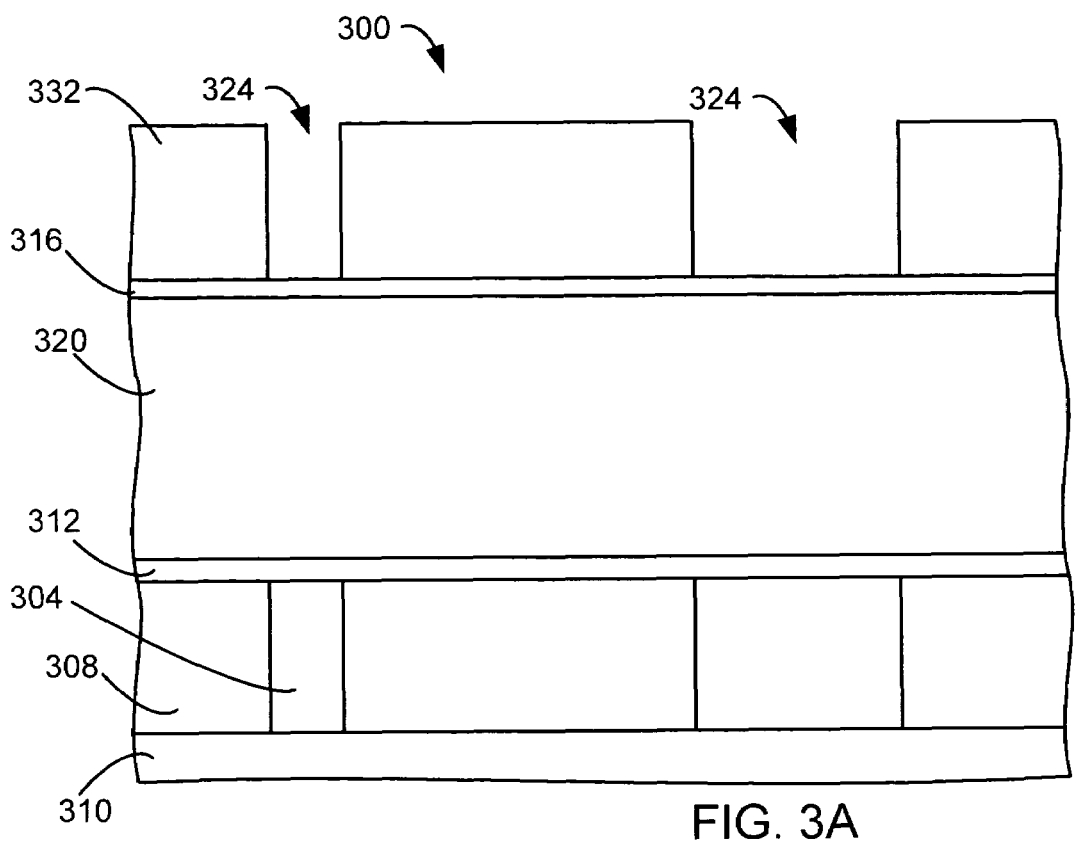
FIGS. 3A–H are schematic views of the formation of a dual damascene structure according to the embodiment shown in FIG. 2.

To facilitate understanding, FIG. 2 is a high level flow chart of a process used in an embodiment of the invention. A via mask is provided over a dielectric layer (step 204). FIG. 3A is a cross-sectional view of a stack 300 with a dielectric layer 320 formed over a barrier layer 312, which are formed over a wafer 310. In this example, a layer 308 is disposed between the barrier layer 312 and the wafer 310. Although the layer 308 is shown as being formed on the wafer 310, there may be any number of layers formed between the layer 320 and the wafer 310. The barrier layer 312 may be a silicon carbide (SiC) layer or it may also be SiN. The dielectric layer 320 may be a low-k dielectric, such as organosilicate dielectrics and porous dielectric, including CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J. SiLK™ or advanced porous SiLK from DOW Chemical Company, Orion® Flowfill™ from Trikon, LKD™ from JSR Corp.

The formation of the via pattern may be performed by forming an anti-reflective layer (ARL) 316 over the dielectric layer 320. The ARL 316 may be formed by spin-on deposition.

A photoresist mask 332 is formed over the ARL 316 (step 204). The photoresist mask may be patterned by exposing a photoresist layer to a patterned light and then developing the photoresist layer 332 to obtain a via apertures 324 in the photoresist layer.

Figure 3B:
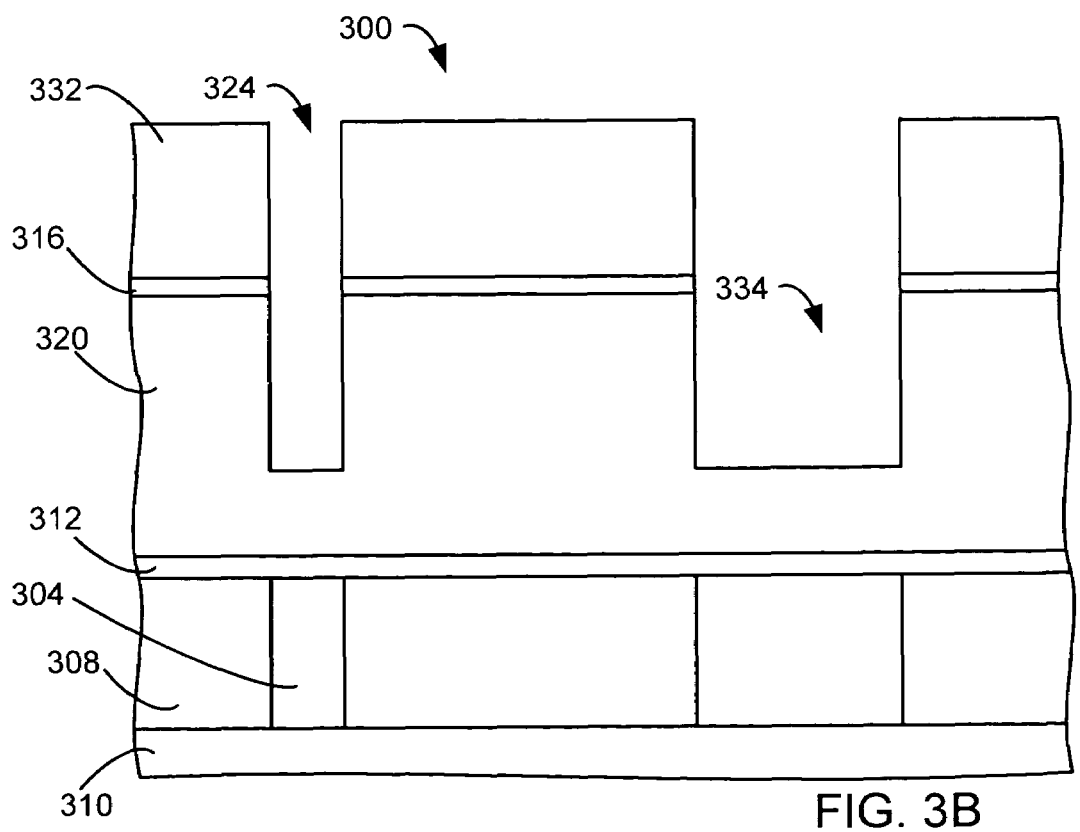
Figure 3C:
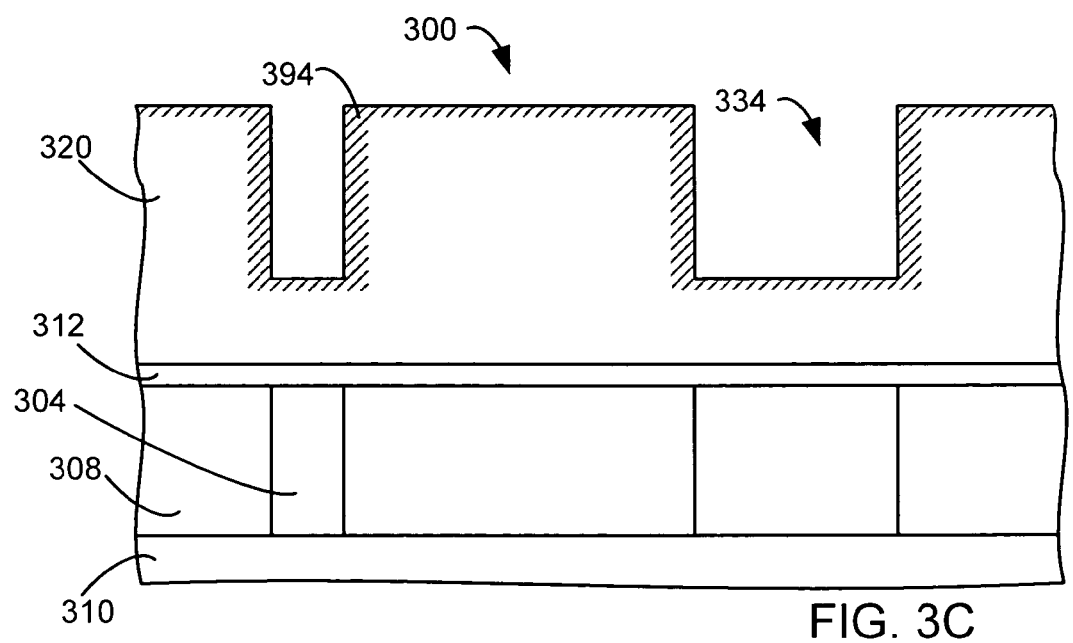

A via is then partially etched through the dielectric layer 320 to form partial vias 334 (step 208), as shown in FIG. 3B. The partial etching of the vias, means that the vias are not etched completely to the barrier layer 312. The via mask is then stripped (step 212). If the dielectric layer is an organosilicate glass and an oxygen ashing is used to strip the via mask, damage regions 394 in the dielectric layer 320 may be caused by the stripping process, as shown in FIG. 3C.

Figure 3D:
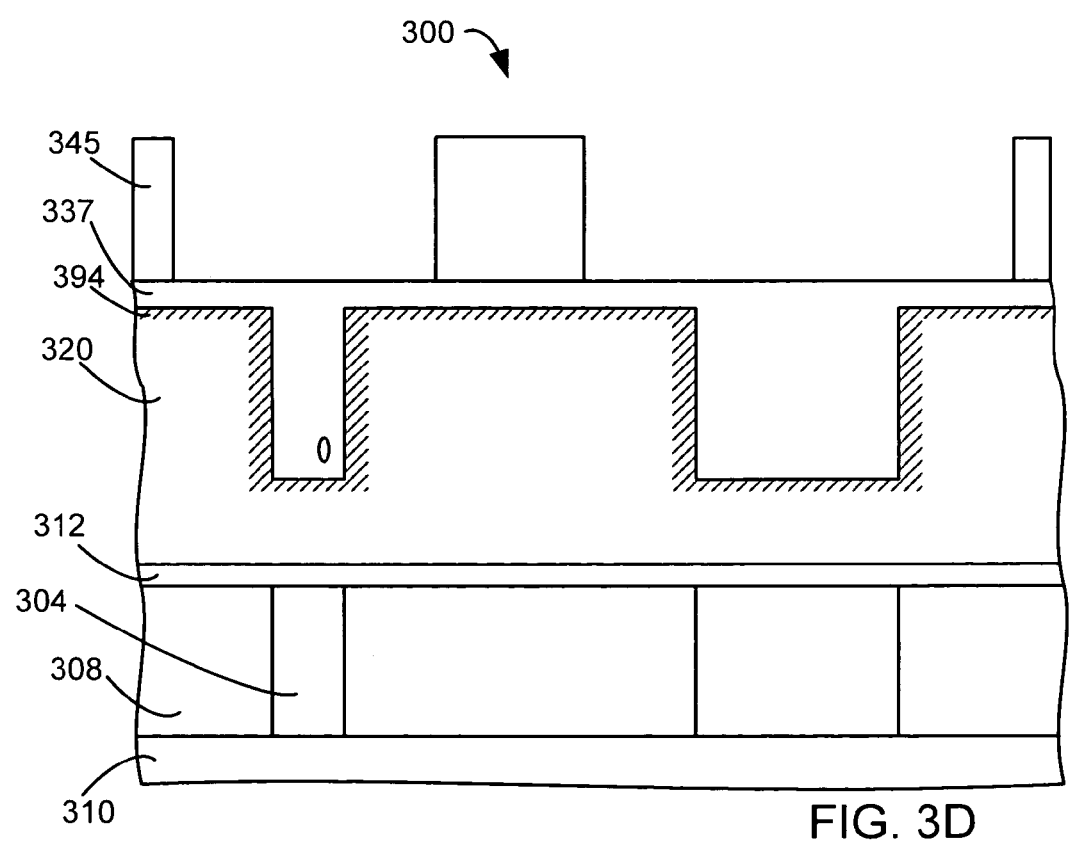

Next a via plug fill is performed (step 216). The via plug fill is accomplished in an embodiment of the invention by placing a spin on via plug material 337 over the dielectric layer 320, which fills the partially etched vias with via plugs of the via plug layer material, as shown in FIG. 3D. Because the vias are shallower (smaller aspect ratio), vias can be easily filled by via-plug materials without voids. The invention may provide less and smaller voids. In addition, voids would cause less defects due to the dielectric material between the via plugs 337 and the barrier layer 312, to prevent punch through. The via plug material 337 may also form a layer over the top surface of the dielectric layer 320. The layer of the via plug material 337 in some embodiments may be used as an antireflective coating. Other embodiments of the invention may not have via plugs.

Figure 3E:
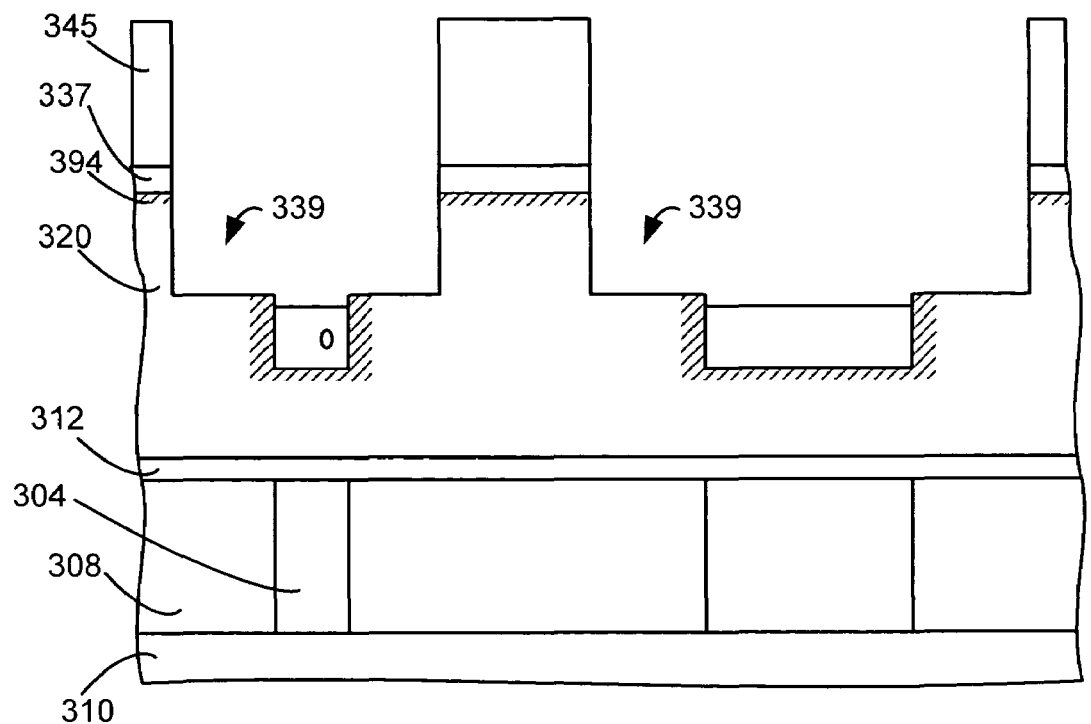
Figure 3F:
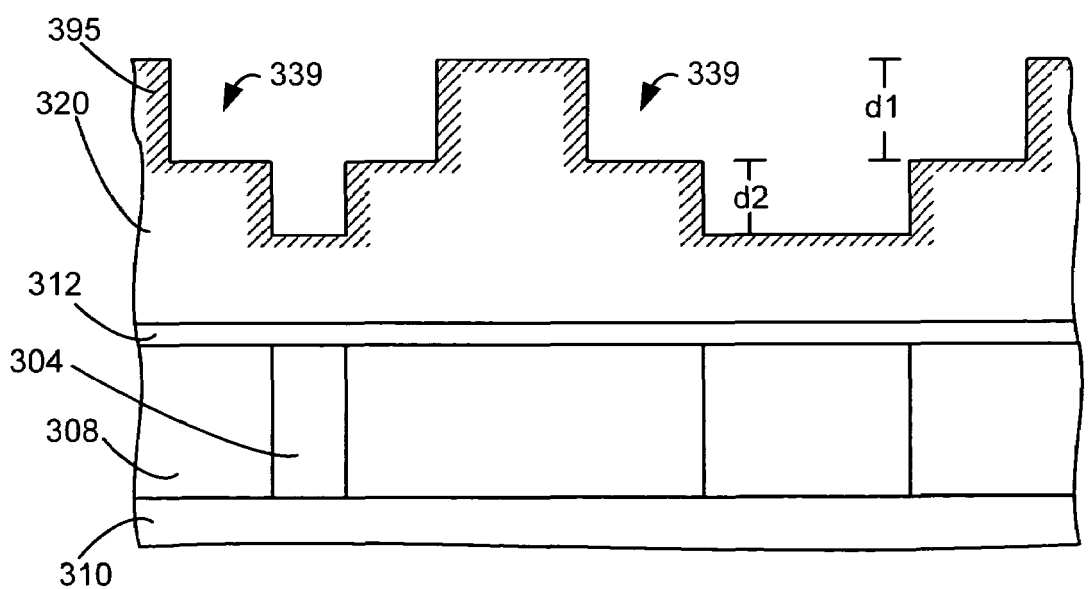

A trench mask 345 is formed and patterned over the layer formed by the via plug material 337 (step 220). Trenches 339 are partially etched into the dielectric layer 320 through the trench mask 345 (step 224), as shown in FIG. 3E. The trench mask is then stripped (step 228). The stripping of the trench mask is also used to remove the via plug material. In this embodiment, the via mask stripping, the trench mask stripping causes damage regions 395, as shown in FIG. 3F.

Figure 3G:
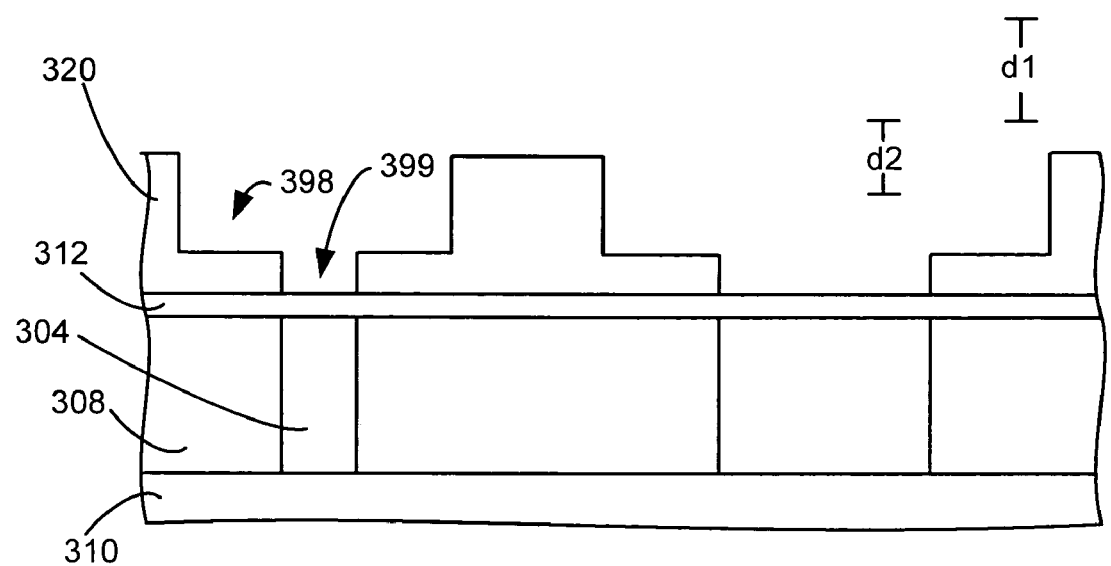

An etch to complete the etching of the via and trench and which etches the top surface of the dielectric is performed (step 232). In this embodiment, this etch is a vertical etch with an ion energy lower than the ion energy used for the partial via etch and the partial trench etch. This lower energy etch is desired, because the absence of a mask and via plug layer subjects exposed corners of the dielectric layer to faceting. A lower ion energy etch reduces such faceting. In addition, it is preferable that the etch is a highly vertical etch. Preferably, the highly vertical etch is an etch that provides a low self dc bias voltage, such as typically less than 100V. The high vertical etch is able to complete the etching of the vias and trenches and etch away the damaged portions of the dielectric layer to form completed vias 398 and completed trenches 399, without significantly increasing the CD of the trenches and vias, as shown in FIG. 3G. In the specification and claims not significantly increasing the CD of the trenches is defined as preventing the CD from increasing more than 5%. In the preferred embodiment, the CD of the trenches is increased less than 5%.

Figure 3H:
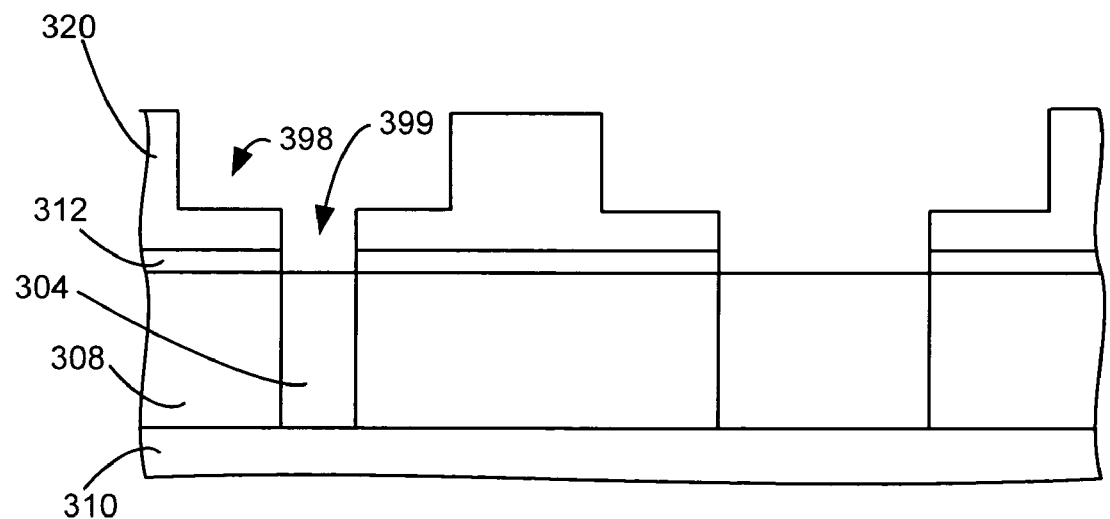

A barrier opening (step 236) is then performed to open the barrier layer 312 to expose the contacts 304, as shown in FIG. 3H.

The dual damascene feature is formed. Additional dual damascene steps may be performed (step 240) to form dual damascene conductive contacts, such as cleaning of etch residue by wet chemicals, forming a barrier layer over the exposed dielectric layer and filling the vias and trenches with a conductor, such as copper.

EXAMPLE

Figure 4:
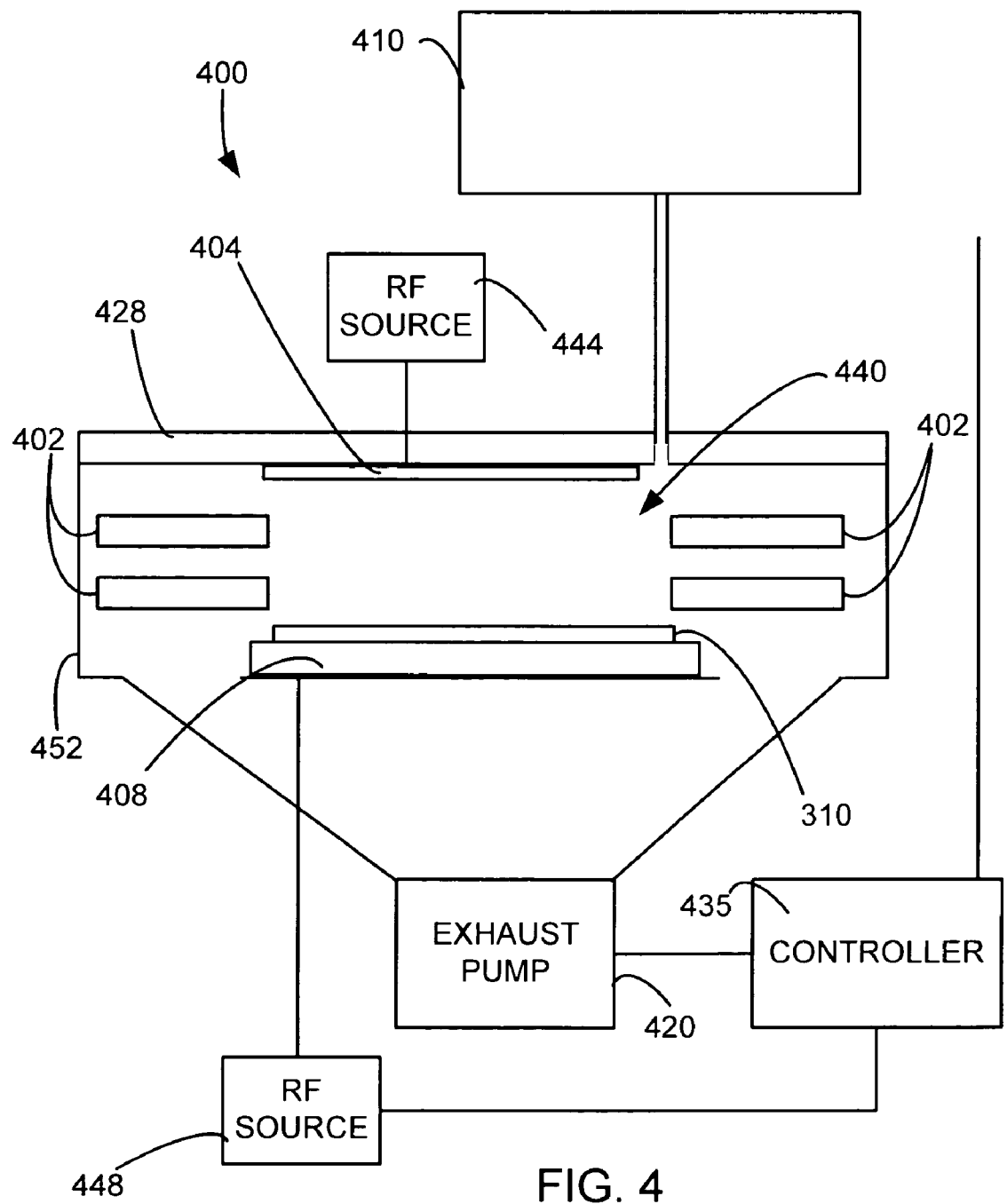
FIG. 4 is a schematic view of a plasma processing chamber that may be used for etching and stripping.

In an example of a preferred embodiment of the invention, the substrate 310 is a silicon wafer and the dielectric layer 320 is OSG (organosilicate glass) or Coral. In the preferred embodiment the barrier layer is of SiC. The vias mask is formed (step 204) using a ArF (193 nmPR) photoresist. In the preferred embodiment, the ARC layer is a bottom antireflective coating (BARC). The substrate 310 is placed in a plasma processing chamber. FIG. 4 is a schematic view of a plasma processing chamber 400 that may be used for etching, and stripping. The plasma processing chamber 400 comprises confinement rings 402, an upper electrode 404, a lower electrode 408, a gas source 410, and an exhaust pump 420. Within plasma processing chamber 400, the substrate 310 is positioned upon the lower electrode 408. The lower electrode 408 incorporates a suitable substrate chucking mechanism (e.g., electrostatic, mechanical clamping, or the like) for holding the substrate 310. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 Mhz power source, and a 2 MHz power source. Different combinations of connecting RF power to the electrode are possible. In a preferred embodiment of the invention, the 27 MHz, 60 MHz, and 2 MHz power sources make up the second RF power source 448 connected to the lower electrode, and the upper electrode is grounded. A controller 435 is controllably connected to the RF sources 444, 448 exhaust pump 420, and the gas source 410.

Figure 5A:
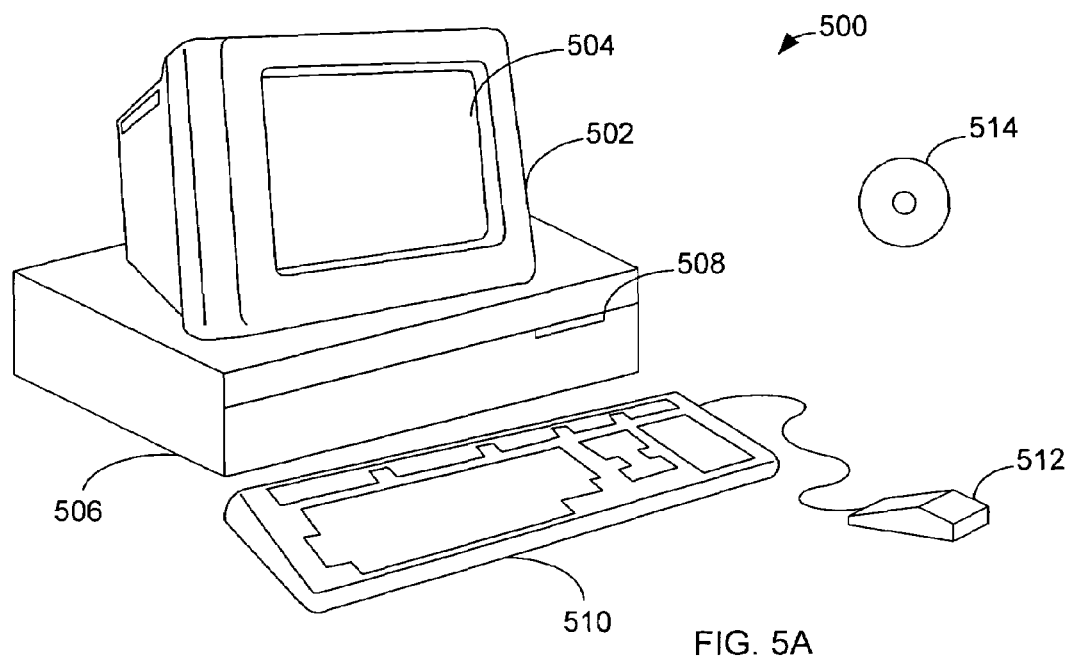
FIGS. 5A–B illustrate a computer system, which is suitable for implementing a controller used in embodiments of the present invention.
Figure 5B:
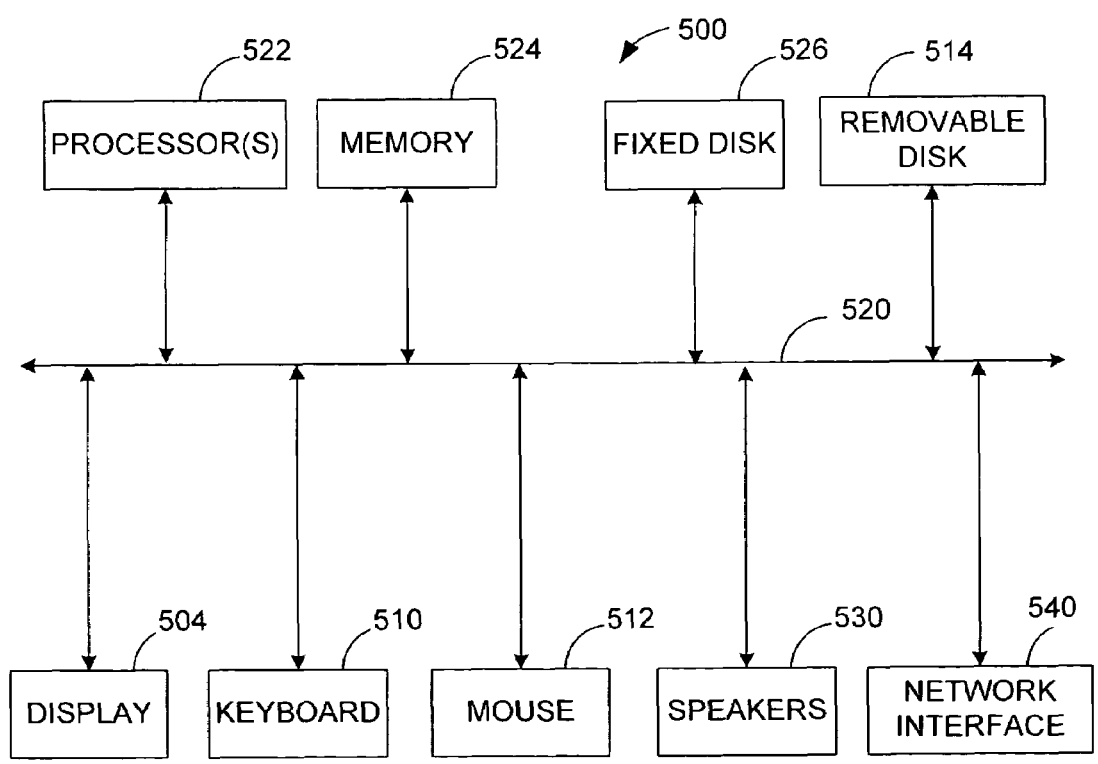

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A via is partially etched (step 208). In this preferred embodiment, etch gases of 100~500 sccm of Ar, 3~15 sccm of $C_4F_8$, 0~20 sccm of O2, and 10~400 sccm of $N_2$ are provided. The chamber pressure was set to 20~500 mTorr. 300~1500 W were provided by the 2 Mhz, 27 MHz RF source or combination of both 2 Mhz and 27 Mhz.

The via mask is then stripped (step 212). Etch gases of 10~3000 sccm of $O_2$ and 20~900 sccm if CO were used. The chamber pressure was set to 5~500 mTorr. 100~1000 W were provided by the 2 Mhz, 27 MHz RF source or combination of both 2 Mhz and 27 Mhz RF power source.

A plug fill is then performed (step 216). The plug-fill was done with photolithography process.

Pattern trench mask is then formed (step 220), using 193 nm PR (ArF).

A trench is partially etched (step 224). 50~500 sccm of Ar, 10~300 sccm of $CF_4$, and 0~30 sccm of $O_2$ was provided. The chamber pressure was set to 20~500 mTorr. 300~3000 W were provided by the 2 Mhz, 27 MHz RF source or combination of both 2 Mhz and 27 Mhz.

The trench mask is then stripped (step 228). Etch gases of 10~3000 sccm of $O_2$ were used. The chamber pressure was set to 5~500 mTorr. 100~1000 W were provided by the 2 Mhz, 27 MHz RF source or combination of both 2 Mhz and 27 Mhz RF power source. As shown in FIG. 3F, a first distance d1 is a distance from the top of the dielectric layer 320 to the bottom of the partially etched trenches 339. A second distance d2 is a distance from the bottom of the partially etched trenches 339 to the bottom of the partially etched vias.

The etch of the via, trench, and top surface of the dielectric is then completed with a vertical etch (step 232). 50~500 sccm of Ar, 10~300 sccm of $CF_4$, and 0~30 sccm of $O_2$ were provided. The chamber pressure was set to 20~500 mTorr. 50~3000 W were provided by the 27 MHz and 60 Mhz RF source or combination of both 27 Mhz and 60 Mhz. Preferably, the top surface of the dielectric layer is vertically etched a distance greater than the first distance d1. In addition, preferably the bottom of the trench is etched a distance greater than the second distance d2, as shown in FIG. 3G. In addition, it is preferable that the partially etched via is etched to the barrier layer. These etch depths are used to remove the damaged regions induced by prior $O_2$ ash process. In a preferred embodiment, the dielectric surface, the via bottom, and the trench bottom are etched a distance of greater than 10 nm during this step. More preferably, the dielectric surface, the via bottom, and the trench bottom are etched a distance of greater than 80 nm. Most preferably, the dielectric surface, the via bottom, and the trench bottom are etched a distance of greater than 150 nm.

A barrier open is then performed (step 236). 50~500 sccm of Ar, 5~300 sccm of $CH_2F_2$, 5~200 sccm of $CHF_3$ and 5~200 sccm of CF4 was provided. The chamber pressure was set to 5~500 mTorr. 100~1000 W were provided by the 2 Mhz, 27 MHz RF source or combination of both 2 Mhz and 27 Mhz RF power source.

Additional processing steps are then performed (step 240). In the preferred embodiment, one additional processing step is filling the completed trench and via with copper or a copper alloy with barrier layer deposition.

In the preferred embodiment the resulting CD for vias is less than 65 nm.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming dual damascene features in a dielectric layer, comprising:
    partially etching vias in the dielectric layer;
    forming a trench pattern mask over the dielectric layer;
    partially etching trenches in the dielectric layer;
    stripping the trench pattern mask; and
    further etching the dielectric layer to complete etch the vias and the trenches in the dielectric layer, wherein the further etching of the dielectric layer to complete etch the vias and the trenches in the dielectric layer etches a top surface of the dielectric layer exposed by stripping the trench pattern mask.

2. The method, as recited in claim 1, wherein a barrier layer is disposed below the dielectric layer, further comprising opening the barrier layer after the further etching the dielectric layer to complete the vias and trenches in the dielectric layer, and wherein the further etching the dielectric layer to complete the vias and trenches etches the vias to the barrier layer.

3. The method, as recited in claim 2, wherein the further etching the dielectric layer is a substantially vertical etch.

4. The method, as recited in claim 3, wherein the partial etching of the vias uses a first ion energy and the partial etching of the trenches uses a second ion energy, and wherein the further etching of the dielectric layer uses a third ion energy, wherein the third ion energy is less than the first ion energy and the second ion energy to reduce faceting during the further etching of the dielectric layer.

5. The method, as recited in claim 2, further comprising performing a via plug fill after partially etching the via and before forming the trench pattern mask.

6. The method, as recited in claim 5, wherein via plug-fill can be conformally filled into partial via without any void due to shallow etched via.

7. The method, as recited in claim 5, further comprising forming a via pattern mask before partially etching vias.

8. The method, as recited in claim 7, further comprising stripping the via pattern mask after partially etching vias and before performing a via plug fill.

9. The method, as recited in claim 8, wherein the partial etching of the vias uses a first ion energy and the partial etching of the trenches uses a second ion energy, and wherein the further etching of the dielectric layer uses a third ion energy, wherein the third ion energy is less than the first ion energy and the second ion energy to reduce faceting during the further etching of the dielectric layer.

10. The method, as recited in claim 9, wherein dielectric layer is a low-k dielectric layer and stripping the via pattern mask and stripping the trench pattern mask damages regions of the low-k dielectric layer, wherein the further etching the dielectric layer to complete etch the vias and the trenches in the dielectric layer etches away damaged regions of the low-k dielectric layer.

11. A method for forming dual damascene features in a dielectric layer, comprising:
    partially etching vias in the dielectric layer;
    forming a trench pattern mask over the dielectric layer;
    partially etching trenches in the dielectric layer;
    stripping the trench pattern mask; and
    further etching the dielectric layer to complete etch the vias and the trenches in the dielectric layer, wherein the partially etching the trenches etches trench bottoms a first distance and after the partially etching the trenches distances between bottoms of the partially etched trenches and bottoms of the partially etched vias are a second distance, wherein the further etching the dielectric layer etches a top surface of the dielectric layer a third distance greater than the first distance and etches the trench bottoms a fourth distance greater than the second distance.

12. A method for forming dual damascene features in a dielectric layer, comprising:
    partially etching vias in the dielectric layer;
    forming a trench pattern mask over the dielectric layer;
    partially etching trenches in the dielectric layer;
    stripping the trench pattern mask; and
    further etching the dielectric layer to complete etch the vias and the trenches in the dielectric layer wherein the further etching the dielectric layer etches at least 150 nm from a top surface of the dielectric layer.

13. A method for forming dual damascene features in a dielectric layer over a barrier layer, comprising:
    partially etching vias in the dielectric layer, wherein the partially etched vias do not extend to the barrier layer;
    forming a trench pattern mask over the dielectric layer;
    partially etching trenches in the dielectric layer;
    stripping the trench pattern mask; and
    further etching the dielectric layer to complete etch the vias and the trenches in the dielectric layer, so that the completed vias extend to the barrier layer, wherein the dielectric layer is not under a mask pattern so that a top surface of the dielectric layer is etched.

14. The method, as recited in claim 13, wherein the further etching the dielectric layer is a substantially vertical etch and wherein the partial etching of the vias uses a first ion energy and the partial etching of the trenches uses a second ion energy, and wherein the further etching of the dielectric layer uses a third ion energy, wherein the third ion energy is less than the first ion energy and the second ion energy to reduce faceting during the further etching of the dielectric layer.

15. The method, as recited in claim 13, further comprising:
    forming a via pattern mask before partially etching vias; and
    performing a via plug fill after partially etching the via and before forming the trench pattern mask.

16. The method, as recited in claim 13, wherein the partially etching the trenches etches trench bottoms a first distance and after the partially etching the trenches distances between bottoms of the partially etched trenches and bottoms of the partially etched vias are a second distance, wherein the further etching the dielectric layer etches a top surface of the dielectric layer a third distance greater than the first distance and etches the trench bottoms a fourth distance greater than the second distance.

* * * * *